US012604770B2

(12) United States Patent
Kwon et al.

(10) Patent No.: US 12,604,770 B2
(45) Date of Patent: Apr. 14, 2026

(54) SEMICONDUCTOR PACKAGE

(71) Applicant: SAMSUNG ELECTRONICS CO., LTD., Suwon-si (KR)

(72) Inventors: Heungkyu Kwon, Suwon-si (KR); Taewoo Kang, Suwon-si (KR); Taehun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 593 days.

(21) Appl. No.: 17/983,145

(22) Filed: Nov. 8, 2022

(65) Prior Publication Data

US 2023/0144388 A1     May 11, 2023

(30) Foreign Application Priority Data

Nov. 9, 2021     (KR) ........................ 10-2021-0153378
Aug. 12, 2022     (KR) ........................ 10-2022-0101578

(51) Int. Cl.
| | |
|---|---|
| *H01L 25/18* | (2023.01) |
| *H01L 23/00* | (2006.01) |
| *H01L 23/367* | (2006.01) |
| *H01L 23/42* | (2006.01) |

(52) U.S. Cl.
CPC ............ *H01L 25/18* (2013.01); *H01L 23/367* (2013.01); *H01L 23/42* (2013.01); *H01L 23/562* (2013.01); *H01L 24/16* (2013.01); *H01L 24/32* (2013.01); *H01L 24/33* (2013.01); *H01L 24/73* (2013.01); *H01L 2224/16227* (2013.01); *H01L 2224/32225* (2013.01); *H01L 2224/33181* (2013.01); *H01L 2224/73204* (2013.01); *H01L 2224/73253* (2013.01)

(58) Field of Classification Search
CPC ...................................................... H01L 25/18
See application file for complete search history.

(56) References Cited

U.S. PATENT DOCUMENTS

| | | | | |
|---|---|---|---|---|
| 6,472,762 | B1 * | 10/2002 | Kutlu | ................. H01L 23/3735 257/E23.101 |
| 7,196,411 | B2 * | 3/2007 | Chang | ................. H01L 25/0652 257/713 |
| 9,257,364 | B2 * | 2/2016 | Ahuja | ................. H01L 21/4882 |

(Continued)

FOREIGN PATENT DOCUMENTS

| | | |
|---|---|---|
| CN | 111739855 B | 11/2020 |
| KR | 10-2019-0130444 A | 11/2019 |

OTHER PUBLICATIONS

Communication dated Feb. 23, 2026 issued by the Korean Intellectual Property Office in counterpart Korean Application No. 10-2022-0101578.

*Primary Examiner* — Dale E Page
*Assistant Examiner* — Rohit Parthasarathy
(74) *Attorney, Agent, or Firm* — Sughrue Mion, PLLC

(57)     ABSTRACT

A semiconductor package includes a package substrate including a first chip mounting area, a second chip mounting area, and a third chip mounting area spaced apart from one another in a first direction, semiconductor chips mounted on the first to third chip mounting areas, a first stiffener mounted on the package substrate to separate the first chip mounting area from the second chip mounting area, and a second stiffener mounted on the package substrate to separate the second chip mounting area from the third chip mounting area.

19 Claims, 13 Drawing Sheets

(56) References Cited

U.S. PATENT DOCUMENTS

|  |  |  |  |  |
|---|---|---|---|---|
| 9,818,700 | B2 * | 11/2017 | Chen | H01L 23/16 |
| 10,461,003 | B2 * | 10/2019 | Karhade | H01L 23/16 |
| 10,573,579 | B2 * | 2/2020 | Chen | H01L 23/562 |
| 11,233,015 | B2 * | 1/2022 | Eid | H01L 23/42 |
| 11,302,592 | B2 * | 4/2022 | Pan | H01L 23/3672 |
| 11,367,628 | B2 * | 6/2022 | Shah | H01L 23/3157 |
| 12,027,471 | B2 * | 7/2024 | Choi | H01L 25/105 |
| 2002/0066955 | A1 * | 6/2002 | Shibamoto | H01L 23/3675 |
|  |  |  |  | 257/E23.101 |
| 2006/0249852 | A1 * | 11/2006 | Chiu | H01L 23/36 |
|  |  |  |  | 257/E23.101 |
| 2009/0079071 | A1 * | 3/2009 | Webb | H05K 1/0271 |
|  |  |  |  | 438/118 |
| 2010/0327421 | A1 * | 12/2010 | Luan | H01L 23/16 |
|  |  |  |  | 438/126 |
| 2011/0068427 | A1 * | 3/2011 | Paek | H01L 25/0657 |
|  |  |  |  | 257/E21.705 |
| 2014/0131877 | A1 * | 5/2014 | Chen | H01L 23/562 |
|  |  |  |  | 257/769 |
| 2015/0228553 | A1 * | 8/2015 | Saeidi | H01L 24/33 |
|  |  |  |  | 438/122 |
| 2017/0372979 | A1 * | 12/2017 | Gandhi | H01L 23/3675 |
| 2018/0261528 | A1 * | 9/2018 | Chen | H01L 23/36 |
| 2019/0115269 | A1 * | 4/2019 | Pan | H01L 23/04 |
| 2019/0148260 | A1 * | 5/2019 | Sikka | H01L 23/433 |
|  |  |  |  | 257/713 |
| 2019/0273079 | A1 * | 9/2019 | Gong | H01L 23/3157 |
| 2021/0057354 | A1 * | 2/2021 | Eid | H01L 23/562 |
| 2021/0225665 | A1 * | 7/2021 | Sinha | H01L 21/563 |
| 2021/0272914 | A1 * | 9/2021 | Chen | H01L 23/562 |
| 2022/0208624 | A1 * | 6/2022 | Kwon | H01L 23/16 |
| 2022/0359322 | A1 * | 11/2022 | Hung | H01L 23/16 |
| 2023/0066839 | A1 * | 3/2023 | Taneda | H01L 23/49838 |
| 2023/0118190 | A1 * | 4/2023 | Lee | H01L 23/053 |
|  |  |  |  | 257/712 |
| 2024/0079349 | A1 * | 3/2024 | Jung | H01L 25/0655 |
| 2024/0413096 | A1 * | 12/2024 | Park | H01L 25/0655 |

* cited by examiner

SEMICONDUCTOR PACKAGE

CROSS-REFERENCE TO RELATED APPLICATIONS

This application claims priority to Korean Patent Application No. 10-2021-0153378 filed on Nov. 9, 2021 and Korean Patent Application No. 10-2022-0101578 filed on Aug. 12, 2022, in the Korean Intellectual Property Office, the disclosures of which are incorporated by reference herein in their entireties.

BACKGROUND

Embodiments to a semiconductor package, and more particularly, to a semiconductor package including a stiffener.

The semiconductor package is a suitable form for using semiconductor chips for an electronic product. In the semiconductor package, it is common to mount the semiconductor chips on a printed circuit board (PCB) and to electrically connect the semiconductor chips by using bonding wires or bumps. Recently, as the semiconductor package has high performance, a size of the semiconductor package is increasing. In a semiconductor package with a relatively large size, the semiconductor package includes a stiffener to control warpage generated by a difference in thermal expansion coefficients of components constituting the semiconductor package.

SUMMARY

One or more embodiments provide a semiconductor package including a stiffener.

According to an aspect of an embodiment, there is provided a semiconductor package including: a package substrate including a first chip mounting area, a second chip mounting area, and a third chip mounting area spaced apart from one another in a first direction, at least one first semiconductor chip on the first chip mounting area, at least one second semiconductor chip on the second chip mounting area, at least one third semiconductor chip on the third chip mounting area, a first stiffener on the package substrate between the first chip mounting area and the second chip mounting area, the first stiffener including a first support pillar on a first corner area of the package substrate, a second support pillar on a second corner area of the package substrate, and a first bridge extending from the first support pillar to the second support pillar in a second direction perpendicular to the first direction and between the first chip mounting area and the second chip mounting area, and a second stiffener on the package substrate between the second chip mounting area and the third chip mounting area, the second stiffener including a third support pillar on a third corner area of the package substrate, a fourth support pillar on a fourth corner area of the package substrate, and a second bridge extending from the third support pillar to the fourth support pillar in the second direction and between the second chip mounting area and the third chip mounting area.

According to another aspect of an embodiment, there is provided a semiconductor package including: a package substrate including a first chip mounting area, a second chip mounting area, and a third chip mounting area spaced apart from one another in a first direction, a stiffener on the package substrate, the stiffener forming a first heat dissipation space on the first chip mounting area, a second heat dissipation space on the second chip mounting area, and a third heat dissipation space on the third chip mounting area, at least one first semiconductor chip on the first chip mounting area and in the first heat dissipation space, at least one second semiconductor chip on the second chip mounting area and in the second heat dissipation space, and at least one third semiconductor chip on the third chip mounting area and in the third heat dissipation space, wherein the stiffener includes a first stiffener including a first support pillar on a first corner area of the package substrate, a second support pillar on a second corner area of the package substrate, and a first bridge extending from the first support pillar to the second support pillar in a second direction perpendicular to the first direction and between the first chip mounting area and the second chip mounting area, and a second stiffener mounted on the package substrate between the second chip mounting area and the third chip mounting area, the second stiffener including a third support pillar on a third corner area of the package substrate, a fourth support pillar on a fourth corner area of the package substrate, and a second bridge extending from the third support pillar to the fourth support pillar in the second direction and between the second chip mounting area and the third chip mounting area, wherein the first heat dissipation space, the second heat dissipation space, and the third heat dissipation space are spaced apart from one another, and wherein the first heat dissipation space, the second heat dissipation space, and the third heat dissipation space are exposed to the outside of the stiffener in a third direction.

According to another aspect of an embodiment, there is provided a semiconductor package including: a package substrate including a first chip mounting area, a second chip mounting area, and a third chip mounting area spaced apart from one another in a first direction, the second chip mounting area including a first sub-mounting area, a second sub-mounting area, and a third sub-mounting area spaced apart from one another in a second direction perpendicular to the first direction, a first memory chip on the first chip mounting area, a first PMIC chip on the first sub-mounting area, a system on chip (SOC) on the second sub-mounting area, a second PMIC chip on the third sub-mounting area, a second memory chip on the third chip mounting area, a first stiffener on the package substrate between the first chip mounting area and the second chip mounting area, the first stiffener including a first support pillar on a first corner area of the package substrate, a second support pillar on a second corner area of the package substrate, and a first bridge extending from the first support pillar to the second support pillar in the second direction and between the first chip mounting area and the second chip mounting area, a second stiffener on the package substrate between the second chip mounting area and the third chip mounting area, the second stiffener including a third support pillar on a third corner area of the package substrate, a fourth support pillar on a fourth corner area of the package substrate, and a second bridge extending from the third support pillar to the fourth support pillar in the second direction and between the second chip mounting area and the third chip mounting area, a first interstiffener bridge extending from the first bridge to the second bridge in the first direction and between the first sub-mounting area and the second sub-mounting area, and a second interstiffener bridge extending from the first bridge to the second bridge in the first direction and between the second sub-mounting area and the third sub-mounting area, and wherein side walls of the SOC are adjacent to the first bridge, the second bridge, the first interstiffener bridge, and the second interstiffener bridge.

BRIEF DESCRIPTION OF DRAWINGS

Embodiments will be more clearly understood from the following detailed description taken in conjunction with the accompanying drawings in which:

FIG. 3A is a cross-sectional view of a semiconductor package taken along the line 3A-3A' of FIG. 1;

FIG. 3B is a cross-sectional view of a semiconductor package taken along the line 3B-3B' of FIG. 1;

FIGS. 5A, 5B, 5C, and 5D are cross-sectional views illustrating semiconductor packages according to embodiments;

FIG. 7A is a cross-sectional view of a semiconductor package taken along the line 7A-7A' of FIG. 6;

FIG. 7B is a cross-sectional view of a semiconductor package taken along the line 7B-7B' of FIG. 6.

DETAILED DESCRIPTION OF EMBODIMENTS

Hereinafter, embodiments will be described in detail with reference to the accompanying drawings. Like numeral references refer to like elements, and their repetitive descriptions are omitted.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Embodiments described herein are example embodiments, and thus, the disclosure is not limited thereto.

Figure 1:
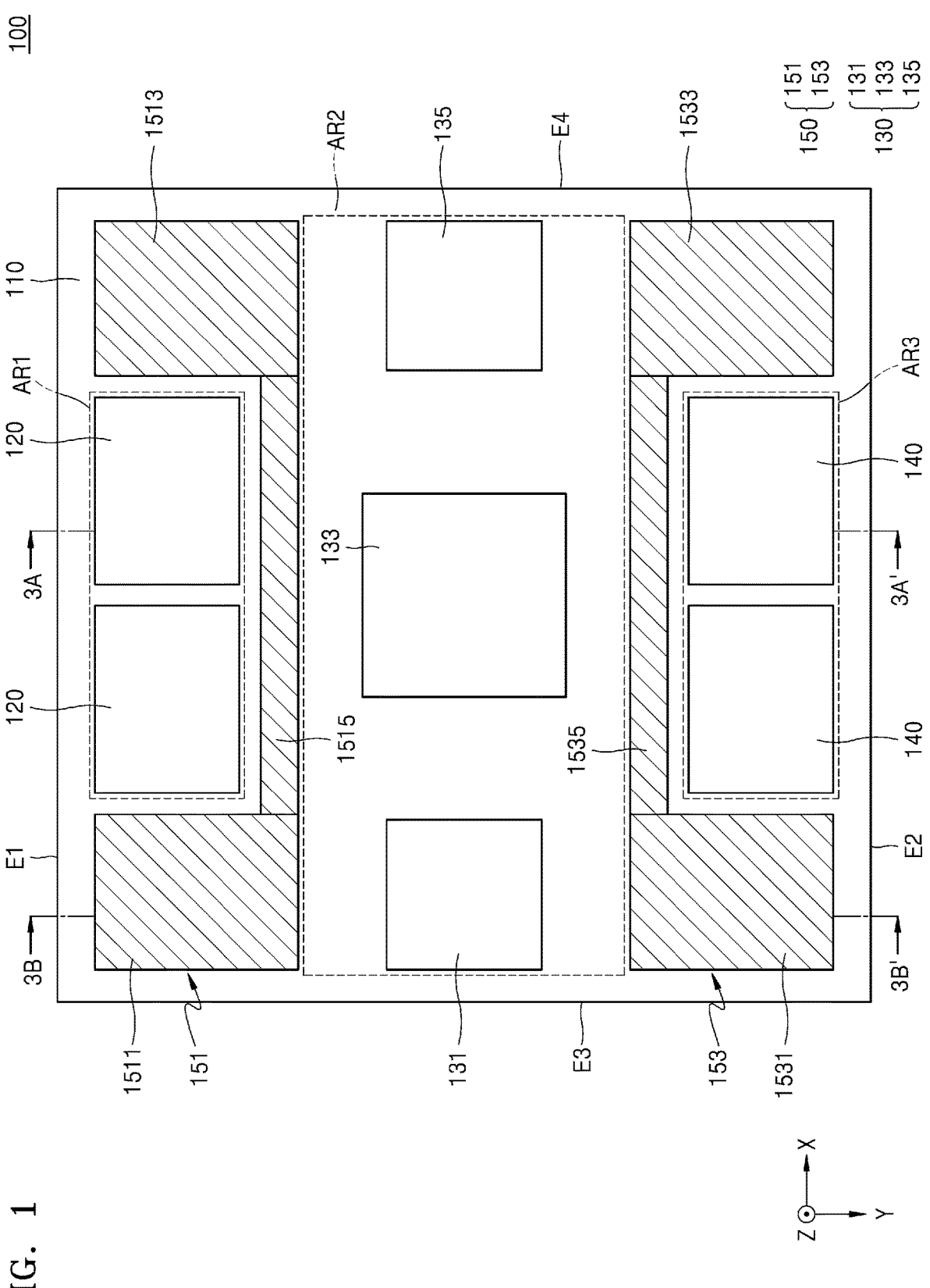
FIG. 1 is a plan view illustrating a semiconductor package according to an embodiment.
Figure 2:
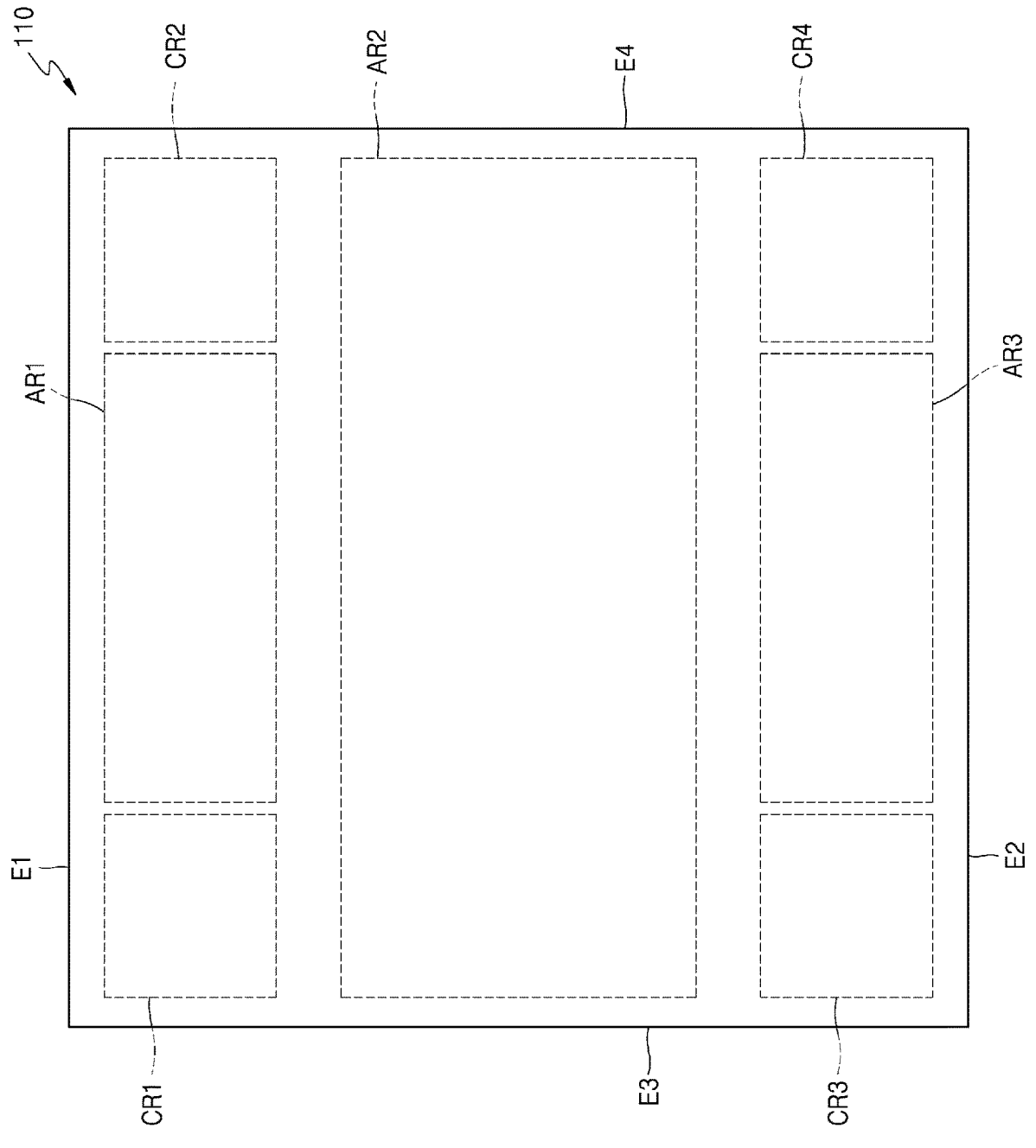
FIG. 2 is a plan view illustrating a package substrate according to an embodiment.
Figure 3A:
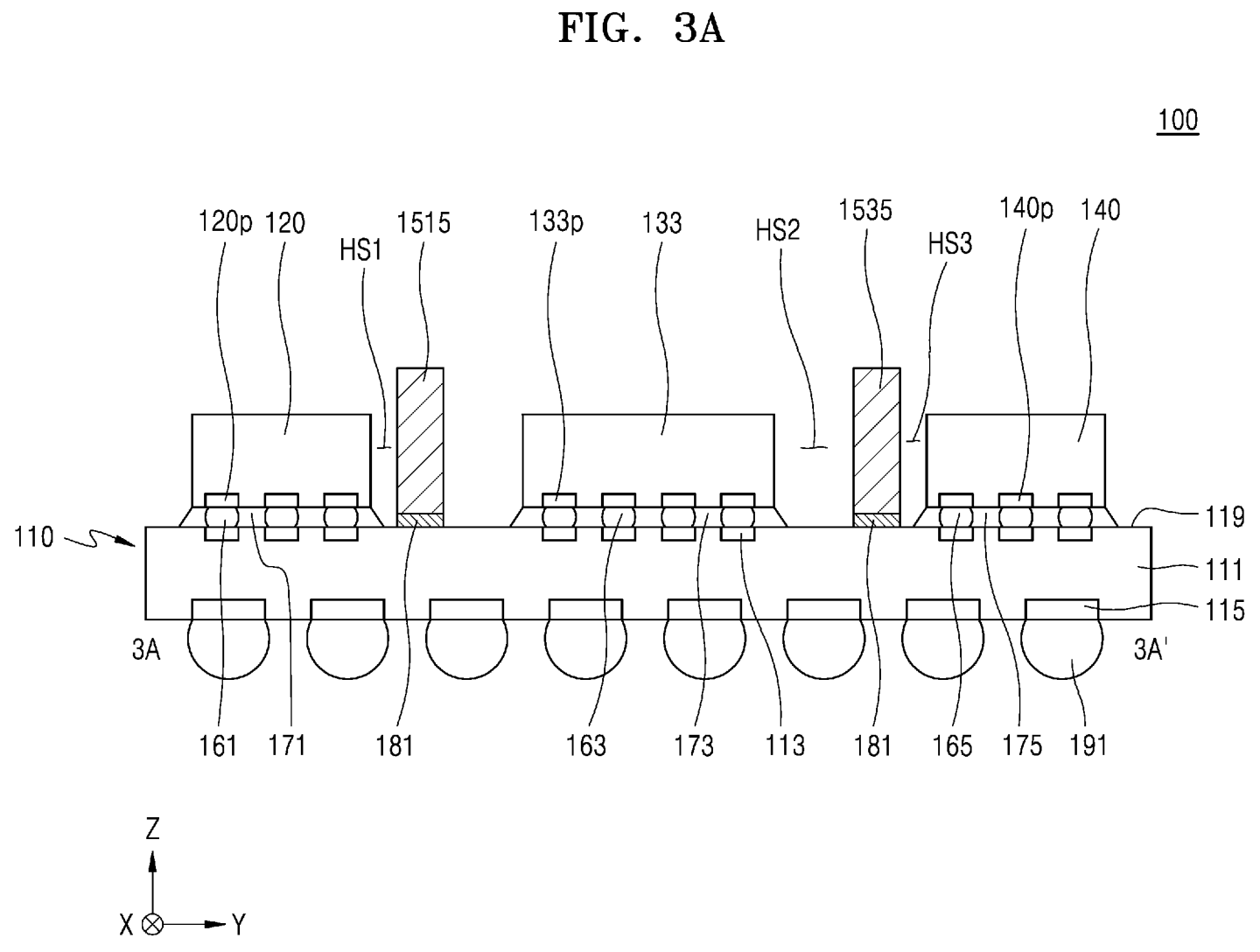
Figure 3B:
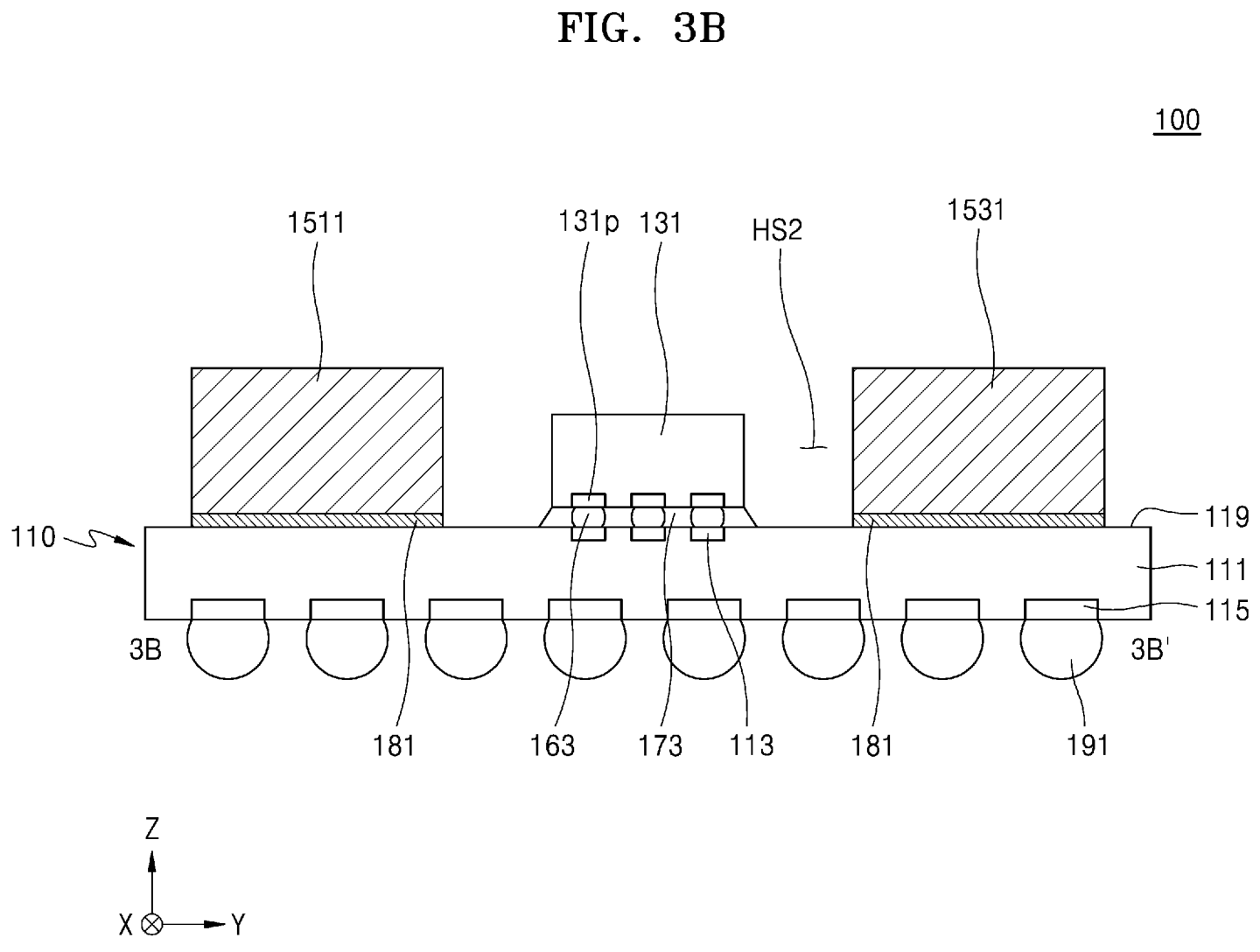

FIG. 1 is a plan view illustrating a semiconductor package 100 according to an embodiment. FIG. 2 is a plan view illustrating a package substrate 110 according to an embodiment. FIG. 3A is a cross-sectional view of the semiconductor package 100 taken along the line 3A-3A' of FIG. 1. FIG. 3B is a cross-sectional view of the semiconductor package 100 taken along the line 3B-3B' of FIG. 1.

Referring to FIGS. 1, 2, 3A, and 3B, the semiconductor package 100 may include a package substrate 110, at least one first semiconductor chip 120, at least one second semiconductor chip 130, at least one third semiconductor chip 140, and a stiffener 150.

The package substrate 110 may include, for example, a printed circuit board (PCB). The package substrate 110 may include a core insulating layer 111, a plurality of upper connection pads 113, and a plurality of lower connection pads 115.

The core insulating layer 111 may include at least one material selected from phenol resin, epoxy resin, and polyimide. For example, the core insulating layer 111 may include at least one material selected from polyimide, flame retardant 4 (FR-4), tetrafunctional epoxy, polyphenylene ether, epoxy/polyphenylene oxide, bismaleimide triazine (BT), thermount, cyanate ester, and liquid crystal polymer.

The plurality of upper connection pads 113 may be provided on a top surface of the core insulating layer 111. A conductive connection member for electrical and physical connection between the package substrate 110 and mounting components mounted on the package substrate 110 may be attached to the plurality of upper connection pads 113. The plurality of lower connection pads 115 may be provided on a bottom surface of the core insulating layer 111. External connection terminals 191 may be attached to the plurality of lower connection pads 115. The external connection terminals 191 may electrically and physically connect the package substrate 110 to an external device in which the package substrate 110 is mounted. The external connection terminals 191 may include, for example, solder balls or solder bumps. The plurality of upper connection pads 113 may be electrically connected to the plurality of lower connection pads 115 by a metal wiring structure provided in the core insulating layer 111.

For example, the plurality of upper connection pads 113 and the plurality of lower connection pads 115 may include copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or an alloy of the above metals.

The package substrate 110 may be flat plate or flat panel. The package substrate 110 may include a top surface 119 and a bottom surface opposite to each other, and the top surface 119 and the bottom surface may be planes, respectively. Hereinafter, a horizontal direction (for example, an X direction and/or a Y direction) may be defined as a direction parallel to the top surface 119 of the package substrate 110, and a vertical direction (for example, a Z direction) may be defined as a direction perpendicular to the top surface 119 of the package substrate 110.

As illustrated in FIG. 2, the package substrate 110 may have a rectangular shape in a plan view, and the top surface 119 of the package substrate 110 may include a first edge E1, a second edge E2, a third edge E3, and a fourth edge E4. The first and second edges E1 and E2 of the package substrate 110 may extend in a second horizontal direction (for example, the X direction), and the third and fourth edges E3 and E4 may extend in a first horizontal direction (for example, the Y direction) perpendicular to the second horizontal direction (for example, the X direction).

The package substrate 110 may include a first chip mounting area AR1 in which at least one first semiconductor chip 120 is mounted, a second chip mounting area AR2 in which at least one second semiconductor chip 130 is mounted, and a third chip mounting area AR3 in which at least one third semiconductor chip 140 is mounted. As illustrated in FIG. 1, the first chip mounting area AR1, the second chip mounting area AR2, and the third chip mounting area AR3 may be spaced apart from one another in the first horizontal direction (for example, the Y direction).

For example, the first chip mounting area AR1 may be closer to the first edge E1 of the package substrate 110 than the second and third chip mounting areas AR2 and AR3. The first chip mounting area AR1 may be provided between a first corner area CR1 and a second corner area CR2 of the package substrate 110. Here, the first corner area CR1 of the package substrate 110 may be an area near a vertex at which the first edge E1 of the top surface 119 of the package substrate 110 meets the third edge E3 of the top surface 119 of the package substrate 110 and the second corner area CR2 of the package substrate 110 may be an area near a vertex at which the first edge E1 of the top surface 119 of the package substrate 110 meets the fourth edge E4 of the top surface 119 of the package substrate 110. The third chip mounting area AR3 may be closer to the second edge E2 of the package substrate 110 than the first and second chip mounting areas AR1 and AR2. The third chip mounting area AR3 may be provided between a third corner area CR3 and a fourth corner area CR4 of the package substrate 110. Here, the third corner area CR3 of the package substrate 110 may be an area near a vertex at which the second edge E2 of the top surface 119 of the package substrate 110 meets the third edge E3 of the top surface 119 of the package substrate 110 and the fourth corner area CR4 of the package substrate 110 may be an area near a vertex at which the second edge E2 of the top surface 119 of the package substrate 110 meets the fourth edge E4 of the top surface 119 of the package substrate 110.

The second chip mounting area AR2 may be provided between the first chip mounting area AR1 and the third chip mounting area AR3 in the first horizontal direction (for example, the Y direction). The second chip mounting area AR2 may extend from the third edge E3 of the top surface 119 of the package substrate 110 to the fourth edge E4 of the top surface 119 of the package substrate 110.

The first to third semiconductor chips 120, 130, and 140 may be mounted on the package substrate 110 in a flip chip method. The first to third semiconductor chips 120, 130, and 140 may be electrically and physically connected to the package substrate 110 through chip connection bumps attached onto the upper connection pads 113 of the package substrate 110. In embodiments, the first semiconductor chip 120 may be mounted on the first chip mounting area AR1 of the package substrate 110 through first chip connection bumps 161 attached to chip pads 120p of the first semiconductor chip 120 in a flip chip method, the second semiconductor chip 130 may be mounted on the second chip mounting area AR2 of the package substrate 110 through second chip connection bumps 163 attached to chip pads of the second semiconductor chip 130 in a flip chip method, and the third semiconductor chip 140 may be mounted on the third chip mounting area AR3 of the package substrate 110 through third chip connection bumps 165 attached to chip pads 140p of the third semiconductor chip 140 in a flip chip method. For example, the first to third chip connection bumps 161, 163, and 165 may include solder bumps. An underfill layer may be provided between each of the first to third semiconductor chips 120, 130, and 140 and the package substrate 110. For example, a first underfill layer 171 may fill a gap between the package substrate 110 and the first semiconductor chip 120 to cover side walls of each of the first chip connection bumps 161, a second underfill layer 173 may fill a gap between the package substrate 110 and the second semiconductor chip 130 to cover side walls of each of the second chip connection bumps 163, and a third underfill layer 175 may fill a gap between the package substrate 110 and the third semiconductor chip 140 to cover side walls of each of the third chip connection bumps 165. The first to third underfill layers 171, 173, and 175 may be formed of an underfill material such as epoxy resin or a non-conductive film. However, embodiments are not limited thereto. For example, the first to third semiconductor chips 120, 130, and 140 may be mounted on the package substrate

110 in a wire bonding method. Each of the first to third semiconductor chips 120, 130, and 140 may have a thickness of 200 μm to 1,000 μm. However, the thickness of each of the first to third semiconductor chips 120, 130, and 140 is not limited thereto.

The first to third semiconductor chips 120, 130, and 140 may include different types of semiconductor chips and may be electrically connected to one another through the package substrate 110. Each of the first to third semiconductor chips 120, 130, and 140 may include a memory chip, a system on chip (SOC), a logic chip, or a power management integrated circuit (PMIC). The memory chip may include a dynamic random access memory (DRAM) chip, a static RAM (SRAM) chip, a magnetic RAM (MRAM) chip, and/or a NAND flash memory chip. The logic chip may include an application processor (AP), a microprocessor, a central processing unit (CPU), a controller, or an application specific integrated circuit (ASIC).

In embodiments, each of the first and third semiconductor chips 120 and 140 may include a memory chip, for example, a DRAM chip.

In embodiments, a center chip 133, a first edge chip 131, and a second edge chip 135 may be mounted on the second chip mounting area AR2 of the package substrate 110. The center chip 133 may be arranged in the center of the top surface 119 of the package substrate 110 and may be electrically and physically connected to the package substrate 110 through the second chip connection bumps 163 attached to chip pads 133p of the center chip 133. The first edge chip 131 may be laterally spaced apart from the center chip 133 and may be arranged between the center chip 133 and the third edge E3 of the package substrate 110. The first edge chip 131 may be electrically and physically connected to the package substrate 110 through the second chip connection bumps 163 attached to chip pads 131p (refer to FIG. 7B) of the first edge chip 131. The first edge chip 131 may be arranged between a first support pillar 1511 and a third support pillar 1531 in the first horizontal direction (for example, the Y direction). The second edge chip 135 may be laterally spaced apart from the center chip 133 and may be arranged between the center chip 133 and the fourth edge E4 of the package substrate 110. The second edge chip 135 may be electrically and physically connected to the package substrate 110 through the second chip connection bumps 163 attached to chip pads 135p (refer to FIG. 7B) of the second edge chip 135. The second edge chip 135 may be arranged between a second support pillar 1513 and a fourth support pillar 1533 in the first horizontal direction (for example, the Y direction). In addition, a passive element may be further mounted in the second chip mounting area AR2 of the package substrate 110.

In embodiments, the center chip 133 may be an SOC and may include at least two of a logic circuit, a memory circuit, a digital integrated circuit (IC), a radio frequency integrated circuit (RFIC), and an input and output circuit. In addition, the center chip 133 as a server-side SOC may include a DRAM interface for a dual in-line memory module (DIMM), a peripheral component interconnect express (PCIe) interface functioning as a switch, or a CPU. Each of the first edge chip 131 and the second edge chip 135 may be a PMIC chip.

The stiffener 150 may be attached onto the top surface 119 of the package substrate 110. The stiffener 150 may mechanically support the package substrate 110 to improve mechanical properties of the semiconductor package 100. For example, the stiffener 150 may mechanically support the package substrate 110 to relieve and suppress warpage generated by a difference in thermal expansion coefficients of components constituting the semiconductor package 100. The stiffener 150 may include a metal such as steel or Cu. The stiffener 150 may be attached to the top surface 119 of the package substrate 110 through adhesive layers 181.

In embodiments, the stiffener 150 may include a first stiffener 151 and a second stiffener 153 attached to different areas of the package substrate 110.

The first stiffener 151 may be mounted on the package substrate 110 to separate or partition the first chip mounting area AR1 from the second chip mounting area AR2. In a plan view, the first stiffener 151 may be provided adjacent to and partially surround side walls of the first semiconductor chip 120.

The first stiffener 151 may include the first support pillar 1511 attached to the first corner area CR1 of the package substrate 110, the second support pillar 1513 attached to the second corner area CR2 of the package substrate 110, and a first bridge 1515 extending from the first support pillar 1511 to the second support pillar 1513 in the second horizontal direction (for example, the X direction). Each of the first support pillar 1511 and the second support pillar 1513 may have an approximately rectangular horizontal cross-section. In addition, each of the first support pillar 1511 and the second support pillar 1513 may have an approximately rectangular vertical cross-section. The first support pillar 1511 and the second support pillar 1513 may be respectively fixed to the package substrate 110 through the adhesive layers 181. The first bridge 1515 may linearly extend from the first support pillar 1511 to the second support pillar 1513 in the second horizontal direction (for example, the X direction), and one end of the first bridge 1515 may be connected to the first support pillar 1511 and the other end of the first bridge 1515 may be connected to the second support pillar 1513. In a plan view, the first chip mounting area AR1 and the second chip mounting area AR2 may be spaced apart from each other with the first bridge 1515 therebetween. The first bridge 1515 may continuously contact the package substrate 110 in the second horizontal direction (for example, the X direction). The first bridge 1515 may be fixed to the package substrate 110 through the adhesive layer 181. A height of a top surface of the first support pillar 1511, a height of a top surface of the second support pillar 1513, and a height of a top surface of the first bridge 1515 may be equal or similar to one another.

The second stiffener 153 may include the third support pillar 1531 attached to the third corner area CR3, the fourth support pillar 1533 attached to the fourth corner area CR4 of the package substrate 110, and a second bridge 1535 extending from the third support pillar 1531 to the fourth support pillar 1533 in the second horizontal direction (for example, the X direction). Each of the third support pillar 1531 and the fourth support pillar 1533 may have an approximately rectangular horizontal cross-section. In addition, each of the third support pillar 1531 and the fourth support pillar 1533 may have an approximately rectangular vertical cross-section. The third support pillar 1531 and the fourth support pillar 1533 may be respectively fixed to the package substrate 110 through the adhesive layers 181. The second bridge 1535 may linearly extend from the third support pillar 1531 to the fourth support pillar 1533 in the second horizontal direction (for example, the X direction), and one end of the second bridge 1535 may be connected to the third support pillar 1531 and the other end of the second bridge 1535 may be connected to the fourth support pillar 1533. In a plan view, the third chip mounting area AR3 and the second chip mounting area AR2 may be spaced apart from each other with the second bridge 1535 therebetween. The second bridge 1535 may continuously contact the package substrate 110 in the second horizontal direction (for example, the X direction). The second bridge 1535 may be fixed to the package substrate 110 through the adhesive layer 181. A height of a top surface of the third support pillar 1531, a height of a top surface of the fourth support pillar 1533, and a height of a top surface of the second bridge 1535 may be the same as or similar to one another.

The first stiffener 151 and the second stiffener 153 may be symmetrical with each other. For example, in a plan view, the first stiffener 151 and the second stiffener 153 may be symmetrical with each other. In embodiments, the first stiffener 151 and the second stiffener 153 may have a mirror image shape with respect to a plane passing through the center of the package substrate 110 and perpendicular to the top surface 119 of the package substrate 110.

In embodiments, at least a part of the first semiconductor chip 120, at least a part of the second semiconductor chip 130, and at least a part of the third semiconductor chip 140 may be exposed to the outside of the stiffener 150. The first stiffener 151 may not cover the first semiconductor chip 120 so that a top surface of the first semiconductor chip 120 is exposed in the vertical direction (for example, the Z direction). In addition, the first stiffener 151 may not be arranged between the first semiconductor chip 120 and the first edge E1 of the package substrate 110 so that one side wall of the first semiconductor chip 120 closest to the first edge E1 of the package substrate 110 may be exposed to the outside of the first stiffener 151. The second stiffener 153 may not cover the third semiconductor chip 140 so that a top surface of the third semiconductor chip 140 is exposed in the vertical direction (for example, the Z direction). In addition, the second stiffener 153 may not be arranged between the third semiconductor chip 140 and the second edge E2 of the package substrate 110 so that one side wall of the third semiconductor chip 140 closest to the second edge E2 of the package substrate 110 may be exposed to the outside of the second stiffener 153. The second semiconductor chip 130 may be exposed in the vertical direction (for example, the Z direction) without being covered with the stiffener 150. In addition, the stiffener 150 may not be arranged between the second semiconductor chip 130 and the third edge E3 of the package substrate 110 and between the second semiconductor chip 130 and the fourth edge E4 of the package substrate 110 so that the second semiconductor chip 130 may be laterally exposed to the outside of the stiffener 150.

In embodiments, the stiffener 150 may define a first heat dissipation space HS1 on the first chip mounting area AR1, a second heat dissipation space HS2 on the second chip mounting area AR2, and a third heat dissipation space HS3 on the third chip mounting area AR3. The first heat dissipation space HS1 and the second heat dissipation space HS2 are separated by the first stiffener 151, and the third heat dissipation space HS3 and the second heat dissipation space HS2 may be separated by the second stiffener 153. Because the first heat dissipation space HS1 and the second heat dissipation space HS2 are thermally separated by the first stiffener 151, thermal coupling between the first semiconductor chip 120 accommodated in the first heat dissipation space HS1 and the second semiconductor chip 130 accommodated in the second heat dissipation space HS2 may be reduced. In addition, because the third heat dissipation space HS3 and the second heat dissipation space HS2 are thermally separated by the second stiffener 153, thermal coupling between the third semiconductor chip 140 accommodated in the third heat dissipation space HS3 and the second semiconductor chip 130 accommodated in the second heat dissipation space HS2 may be reduced.

A method of manufacturing the semiconductor package 100 may include a process of preparing the package substrate 110, a process of mounting the first to third semiconductor chips 120, 130, and 140 on the package substrate 110, and a process of attaching the first and second stiffeners 151 and 153 onto the package substrate 110.

According to the embodiments, because the semiconductor package 100 includes the stiffener 150 mechanically supporting the package substrate 110, it is possible to prevent or suppress warpage generated by a difference in thermal expansion coefficients of components constituting the semiconductor package 100. In addition, because the stiffener 150 includes the support pillars attached to all the corner areas of the package substrate 110, it is possible to prevent or suppress twist warpage generated by a difference in warpage among the corner areas of the package substrate 110.

A related semiconductor package has a structure in which a ring-shaped stiffener extending along an edge of a mounting substrate is attached to the mounting substrate. In the related semiconductor package, the mounting may need to separately include an edge area for mounting the ring-shaped stiffener. However, according to the embodiments, because the stiffener 150 may be attached to the areas among and between the semiconductor chips mounted on the package substrate 110, and the edges of the package substrate 110 may be used as areas in which mounting components such as the semiconductor chips are mounted, it is possible to enhance rigidity of the semiconductor package 100 by using the stiffener 150 and to miniaturize the semiconductor package 100.

In addition, according to the embodiments, because the semiconductor chips mounted on the package substrate 110 may be exposed upward and laterally through the stiffener 150, heat dissipation characteristics of the semiconductor chips may be improved.

Figure 4:
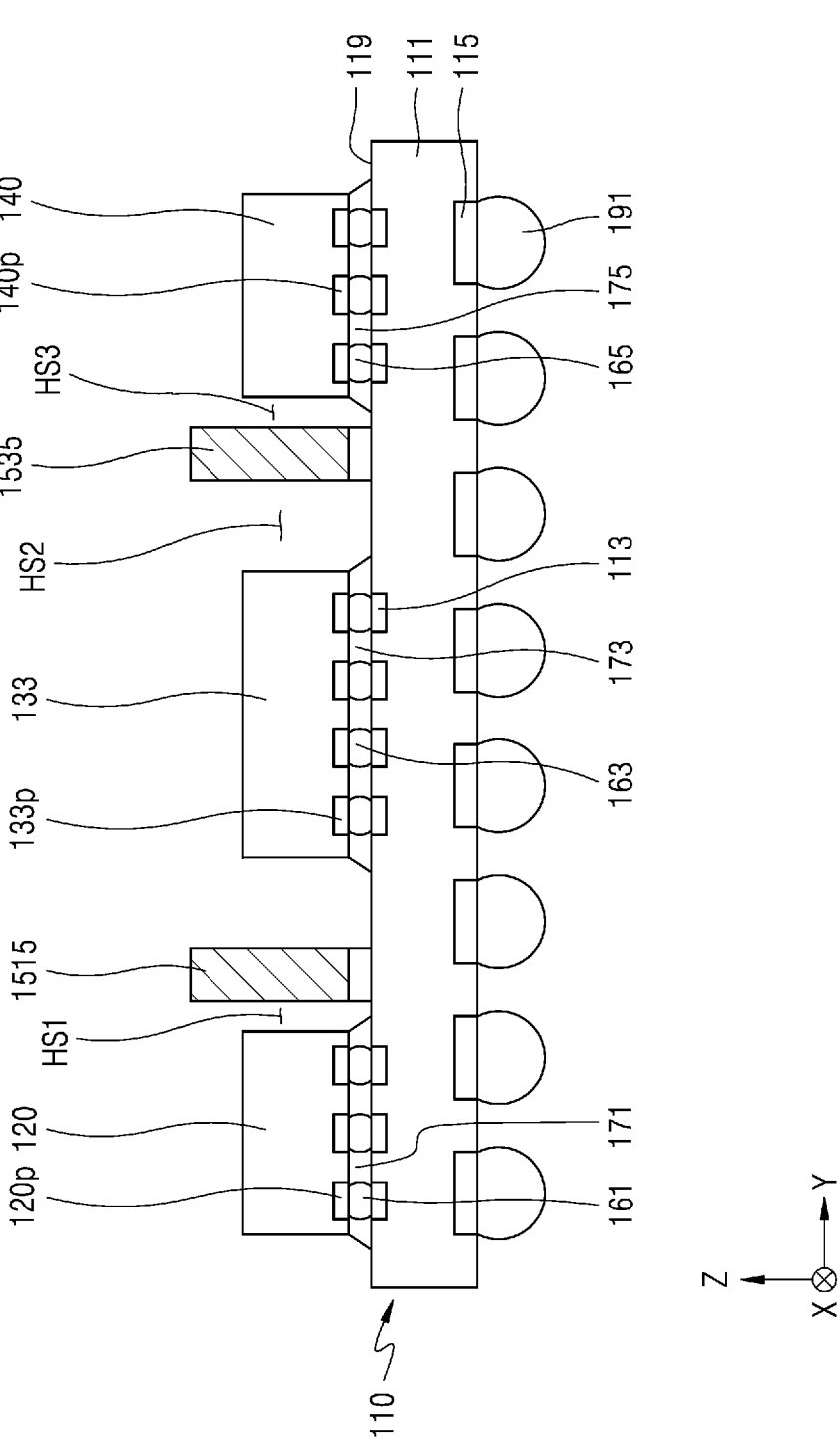
FIG. 4 is a cross-sectional view illustrating a semiconductor package according to an embodiment.

FIG. 4 is a cross-sectional view illustrating a semiconductor package according to an embodiment. Hereinafter, the semiconductor package illustrated in FIG. 4 will be described based on a difference from the semiconductor package 100 described with reference to FIGS. 1 to 3B.

Referring to FIG. 4 together with FIG. 1, the first bridge 1515 of the first stiffener 151 and the second bridge 1535 of the second stiffener 153 may be spaced apart from the package substrate 110. Because the first bridge 1515 of the first stiffener 151 is spaced apart from the package substrate 110, a gap may be formed between a bottom surface of the first bridge 1515 and the top surface 119 of the package substrate 110. In addition, because the second bridge 1535 of the second stiffener 153 is spaced apart from the package substrate 110, a gap may be formed between a bottom surface of the second bridge 1535 and the top surface 119 of the package substrate 110.

FIGS. 5A to 5D are cross-sectional views illustrating semiconductor packages 101, 102, 103, and 104 according to embodiments. Hereinafter, the semiconductor packages 101, 102, 103, and 104 illustrated in FIGS. 5A to 5D will be described based on a difference from the semiconductor package 100 described with reference to FIGS. 1 to 3B.

Figure 5A:
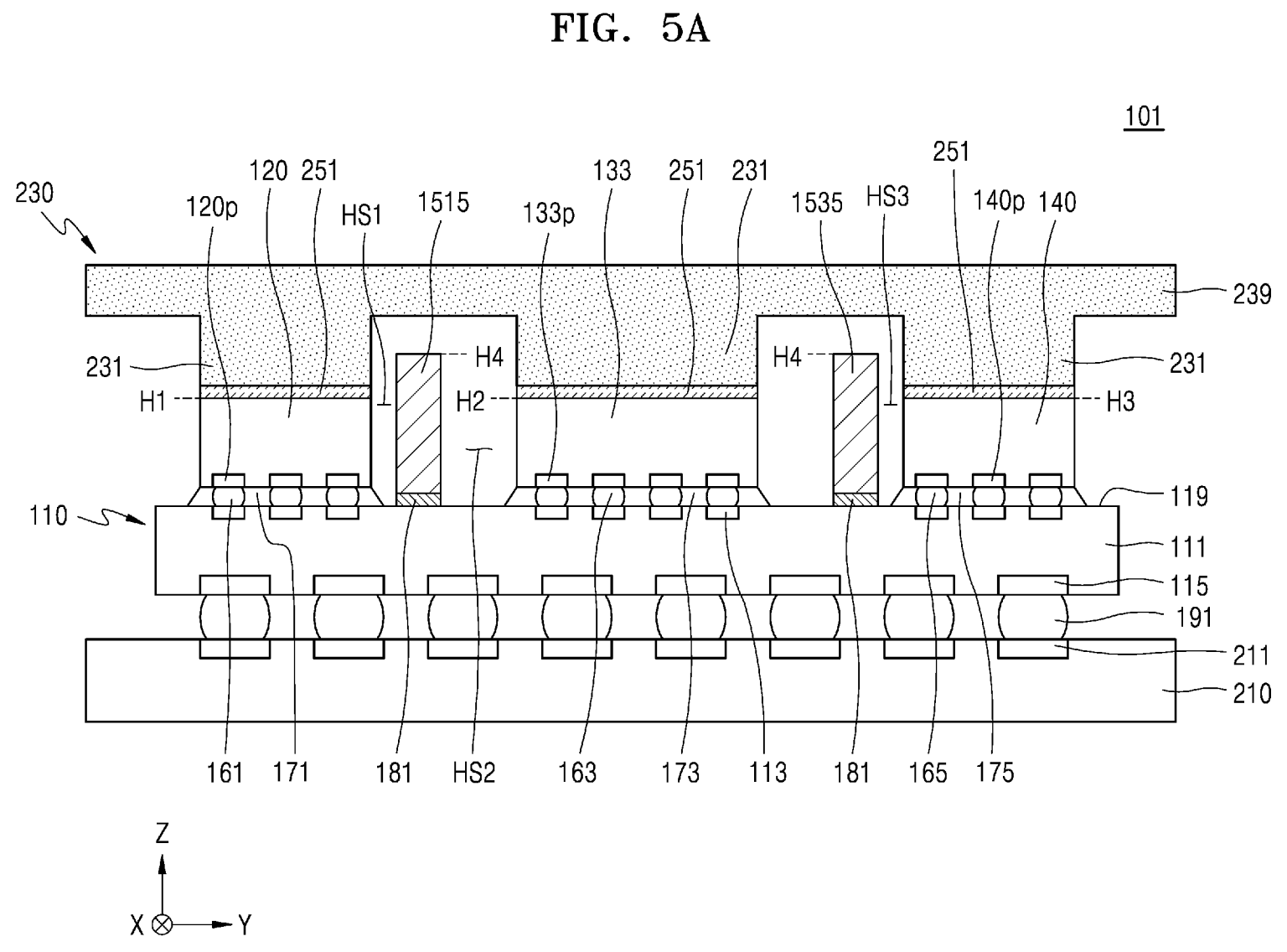

Referring to FIG. 5A together with FIG. 1, the semiconductor package 101 may further include a heat sink 230 and a system board 210.

The heat sink 230 may dissipate heat generated by the first to third semiconductor chips 120, 130, and 140. The heat sink 230 may include a thermal conductive material having high thermal conductivity. For example, the heat sink 230 may include a metal such as Cu or Al, or a carbon-containing material such as graphene, graphite, and/or carbon nanotube. However, the material of the heat sink 230 is not limited to the above-described materials. In embodiments, the heat sink 230 may include a single metal layer or a plurality of stacked metal layers.

The first to third semiconductor chips 120, 130, and 140 may be attached to the heat sink 230 through first thermal interface material (TIM) layers 251. The first TIM layers 251 may include a thermally conductive and electrically insulating material. For example, the first TIM layers 251 may include polymer including metal powder such as silver (Ag) or Cu, thermal grease, white grease, or a combination thereof. The heat sink 230 may directly contact the first to third semiconductor chips 120, 130, and 140 through the first TIM layers 251 to improve heat dissipation characteristics.

In the semiconductor package 101, the top surface of the first semiconductor chip 120 may have a first height H1, a top surface of the second semiconductor chip 130 may have a second height H2, and the top surface of the third semiconductor chip 140 may have a third height H3. In addition, a top surface of the stiffener 150 may have a fourth height H4. The first to fourth heights H1, H2, H3, and H4 may be lengths in the vertical direction (for example, the Z direction), which are measured from the top surface 119 of the package substrate 110. At this time, the fourth height H4 of the top surface of the stiffener 150 may be greater than the first to third heights H1, H2, and H3, and the heat sink 230 may include first protrusions 231 protruding downward from a bottom surface of a base 239 to the first to third semiconductor chips 120, 130, and 140, respectively. The first TIM layers 251 may be arranged between bottom surfaces of the first protrusions 231 and the top surfaces of the first to third semiconductor chips 120, 130, and 140. In addition, so that the first and second bridges 1515 and 1535 of the stiffener 150 are spaced apart from the heat sink 230, a groove accommodating the first bridge 1515 or the second bridge 1535 may be formed in a bottom surface of the heat sink 230.

The system board 210 corresponds to a substrate on which the package substrate 110 is mounted, and may be referred to as a main board or a motherboard. Conductive pads 211 of the system board 210 may be coupled to external connection terminals 191. The system board 210 may include a PCB including main components for operating a system such as a CPU or RAM and an interface for connecting a peripheral device. For example, the system board 210 may include a system board for a server.

Figure 5B:
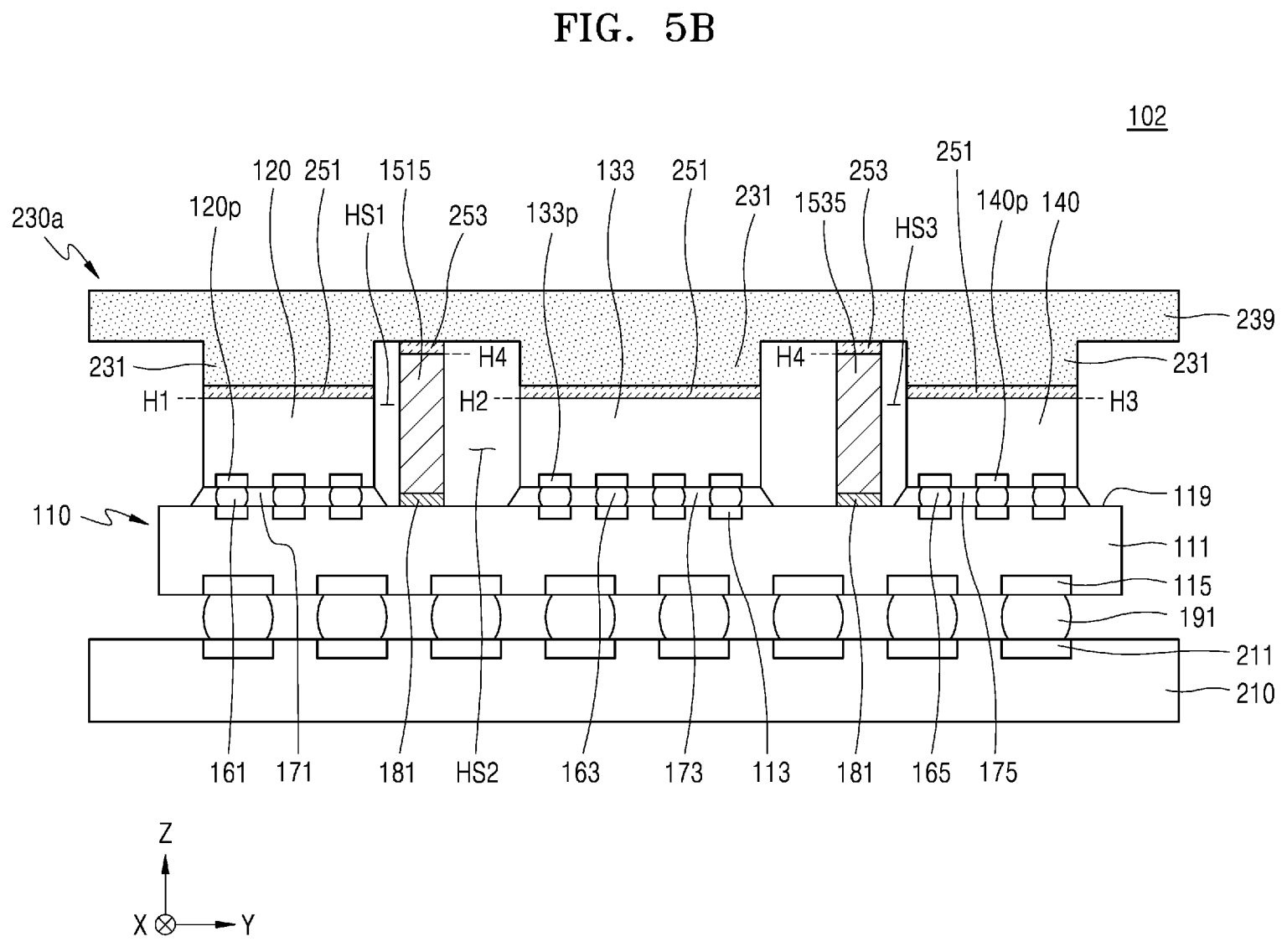

Referring to FIG. 5B together with FIG. 1, in the semiconductor package 102, the stiffener 150 may be attached to a heat sink 230a through second TIM layers 253. The second TIM layers 253 may be arranged between the top surface of the first support pillar 1511, the top surface of the second support pillar 1513, and the top surface of the first bridge 1515 and the heat sink 230a. The second TIM layers 253 may be arranged between the top surface of the third support pillar 1531, the top surface of the fourth support pillar 1533, and the top surface of the second bridge 1535 and the heat sink 230a.

Figure 5C:
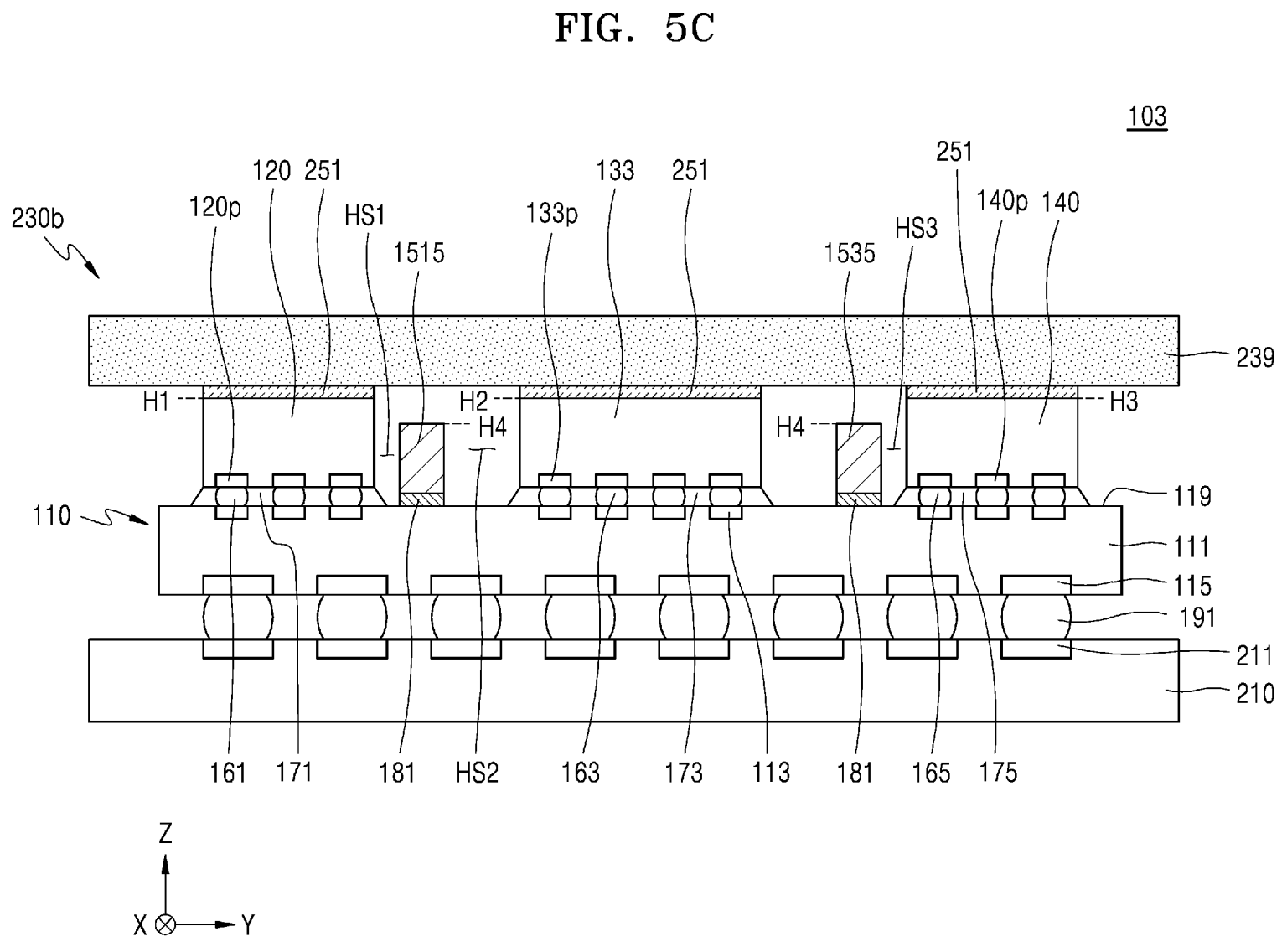

Referring to FIG. 5C together with FIG. 1, in the semiconductor package 103, the fourth height H4 of the top surface of the stiffener 150 (for example, the first bridge 1515 and the second bridge 1535) may be less than the first to third heights H1, H2, and H3 of the first to third semiconductor chips 120, 130, and 140, and an entire bottom surface of a heat sink 230b may be planar. The first to third semiconductor chips 120, 130, and 140 may contact the heat sink 230b through the first TIM layers 251, and the first stiffener 151 may be spaced apart from the heat sink 230b.

Figure 5D:
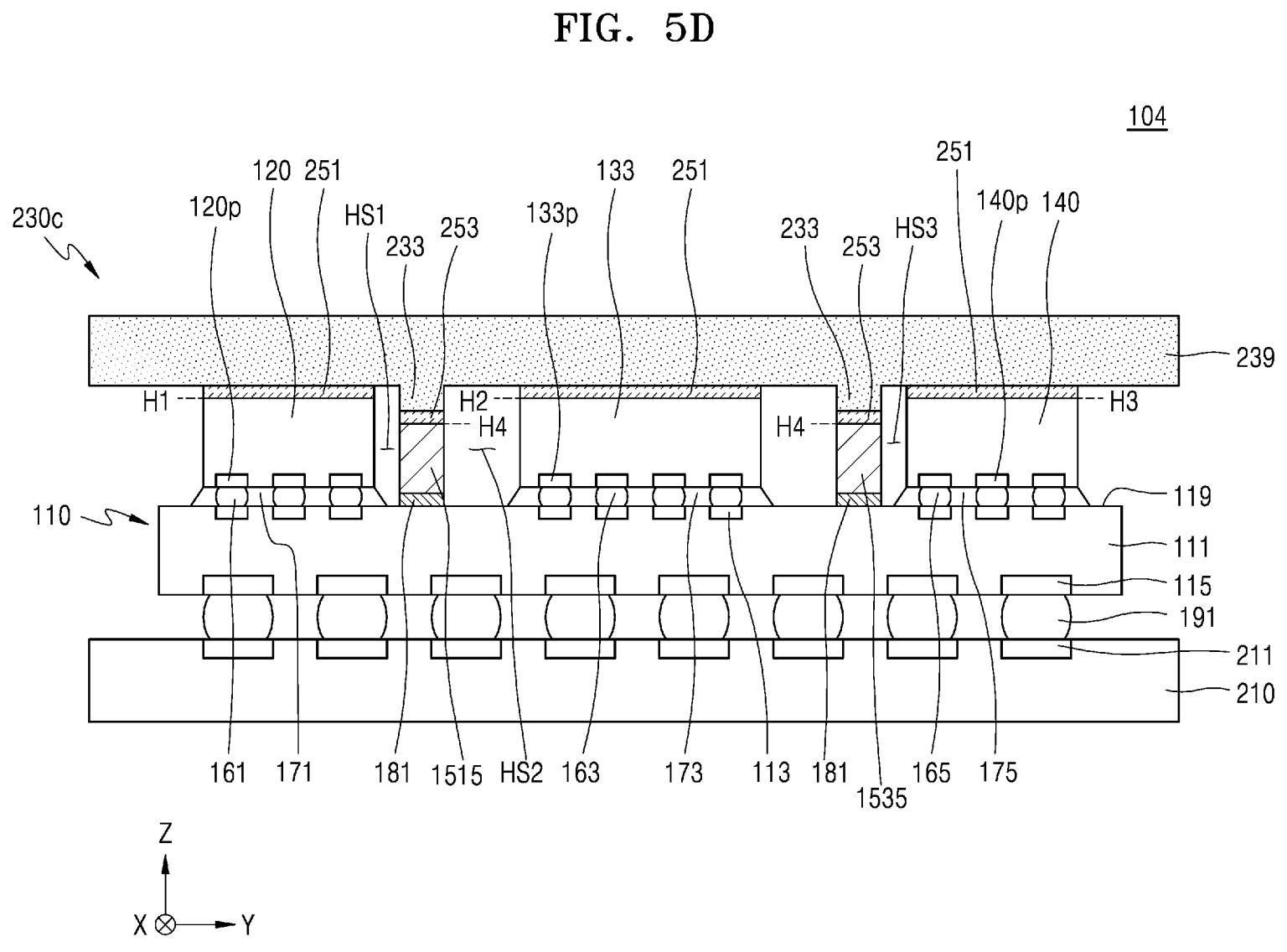

Referring to FIG. 5D together with FIG. 1, in the semiconductor package 104, the fourth height H4 of the top surface of the stiffener 150 (for example, the first support pillar 1511 and the second support pillar 1513) may be less than the first to third heights H1, H2, and H3 of the first to third semiconductor chips 120, 130, and 140, and a heat sink 230c may include second protrusions 233 protruding downward from a bottom surface of a base 239 to the top surface of the stiffener 150. The second protrusions 233 may at least partially contact the top surface of the first support pillar 1511, the top surface of the second support pillar 1513, and the top surface of the first bridge 1515. In addition, the second protrusions 233 may at least partially contact the top surface of the third support pillar 1531, the top surface of the fourth support pillar 1533, and the top surface of the second bridge 1535. The second TIM layers 253 may be arranged between bottom surfaces of the second protrusions 233 and the top surface of the stiffener 150.

Figure 6:
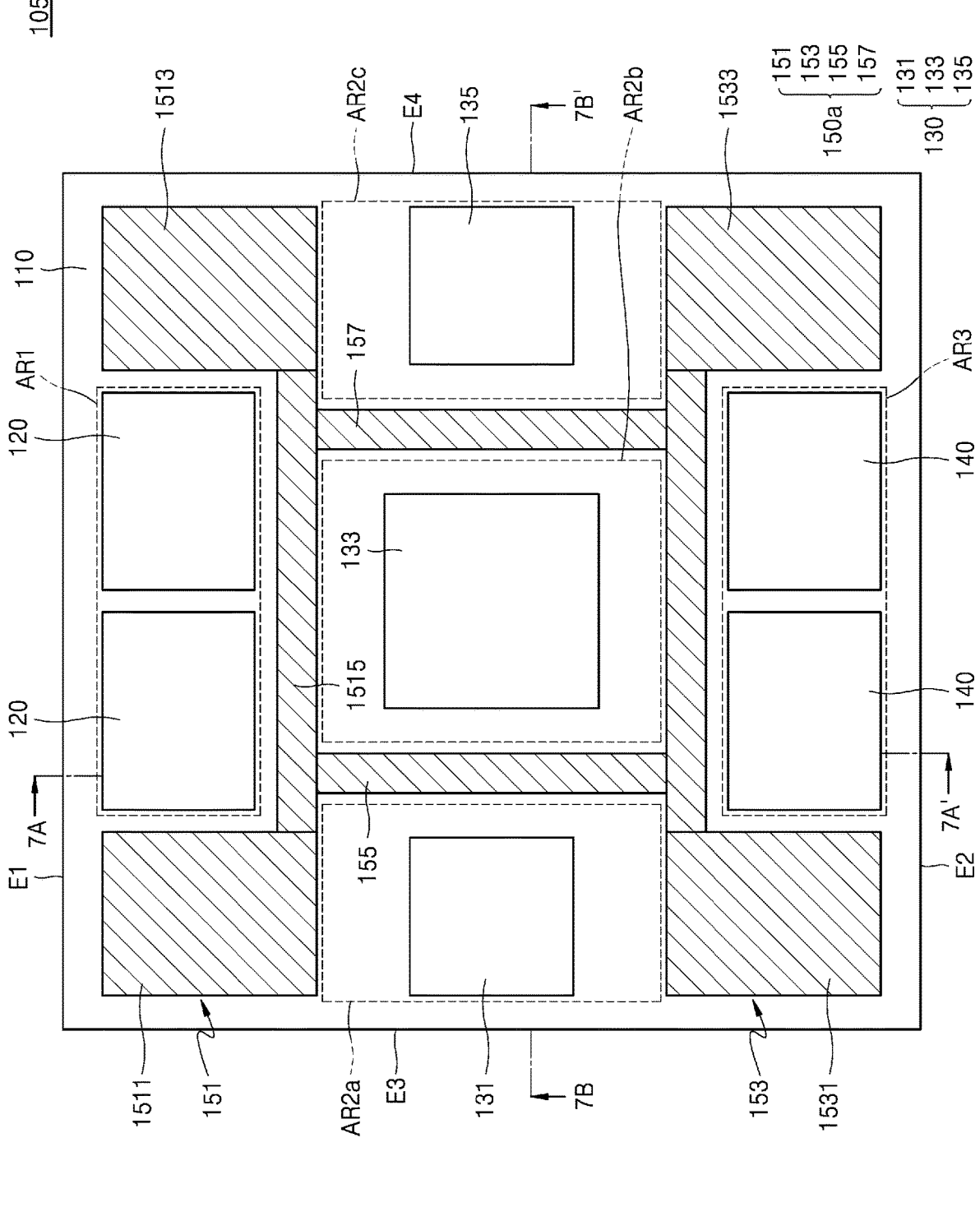
FIG. 6 is a plan view illustrating a semiconductor package according to an embodiment.
Figure 7A:
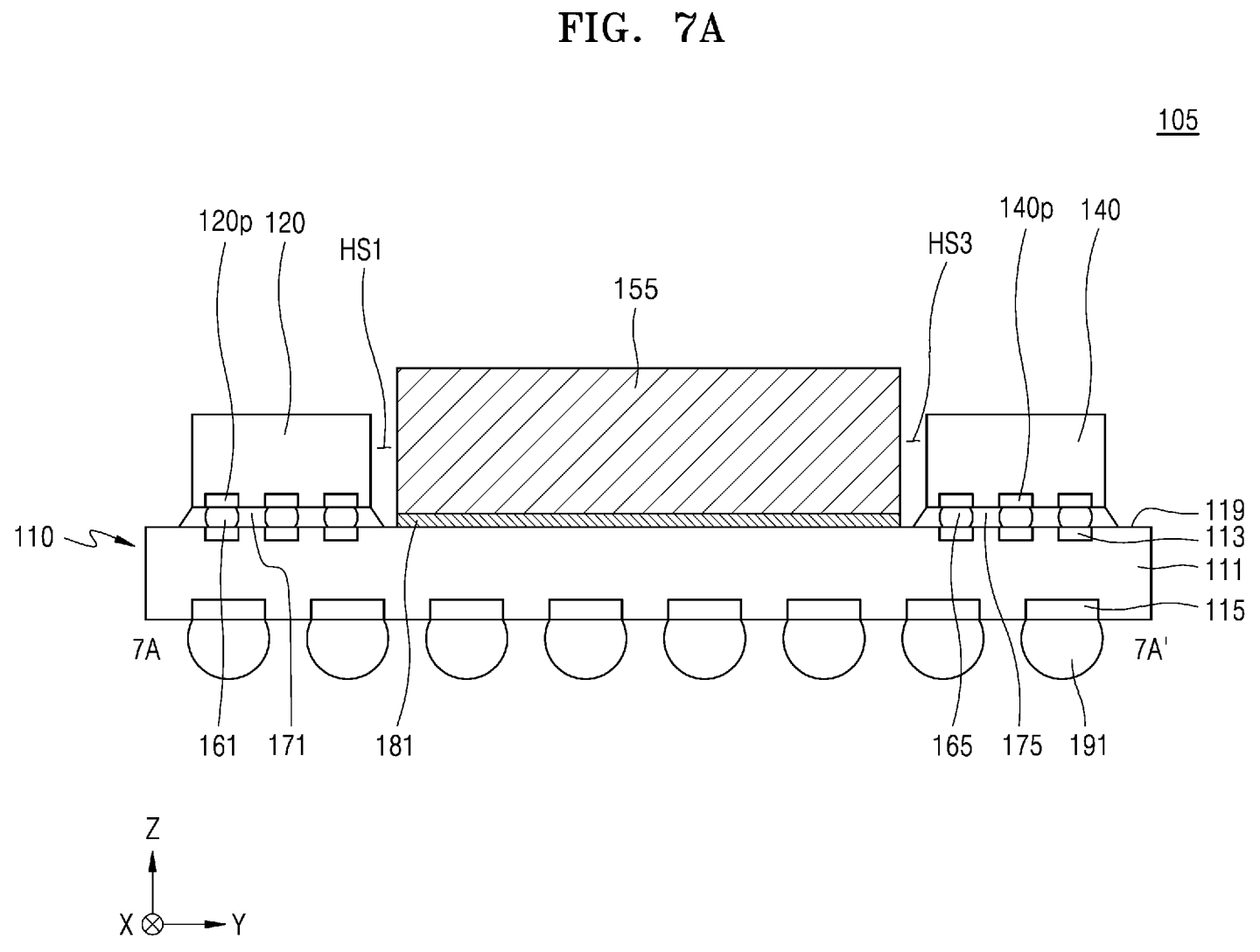
Figure 7B:
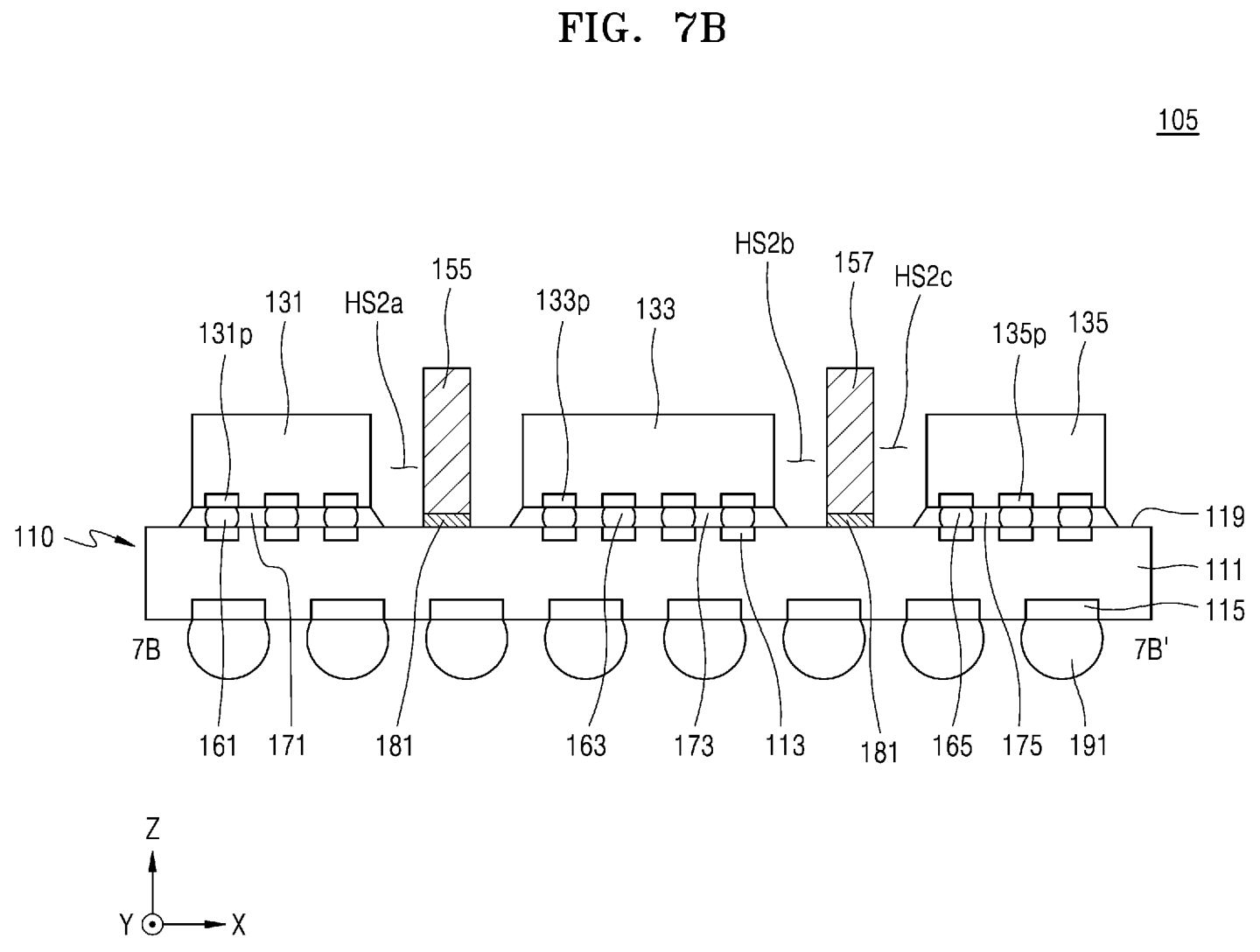

FIG. 6 is a plan view illustrating a semiconductor package 105 according to an embodiment. FIG. 7A is a cross-sectional view of the semiconductor package 105 taken along the line 7A-7A' of FIG. 6. FIG. 7B is a cross-sectional view of the semiconductor package 105 taken along the line 7B-7B' of FIG. 6. Hereinafter, the semiconductor package 105 illustrated in FIGS. 6 to 7B will be described based on a difference from the semiconductor package 100 described with reference to FIGS. 1 to 3B.

Referring to FIGS. 6, 7A, and 7B, a stiffener 150a may include at least one interstiffener bridge extending between a first stiffer 151 and a second stiffener 153. The at least one interstiffener bridge may extend from the first stiffer 151 to the second stiffener 153 in the first horizontal direction (for example, the Y direction) to be connected to the first stiffener 151 and the second stiffener 153. Because the first stiffener 151 is connected to the second stiffener 153 through the at least one interstiffener bridge, the single body or piece stiffener 150a may be provided.

In embodiments, the stiffener 150a may include a first interstiffener bridge 155 and a second interstiffener bridge 157 extending from the first bridge 1515 to the second bridge 1535 in the first horizontal direction (for example, the Y direction). The first and second interstiffener bridges 155 and 157 may be spaced apart from each other in the second horizontal direction (for example, the X direction). The first and second interstiffener bridges 155 and 157 may be arranged on the second chip mounting area AR2 (refer to FIG. 2) of the package substrate 110 and may linearly extend across the second chip mounting area AR2 of the package substrate 110 in the first horizontal direction (for example, the Y direction). The first and second interstiffener bridges 155 and 157 may continuously contact the package substrate 110 in the first horizontal direction (for example, the Y direction). The first and second interstiffener bridges 155 and 157 may be fixed to the package substrate 110 through the adhesive layers 181, respectively. A height of a top surface of the first interstiffener bridge 155 and a height of a top surface of the second interstiffener bridge 157 may be equal or similar to a height of a top surface of the first stiffener 151 or a height of a top surface of the second stiffener 153. The height of the top surface of the first interstiffener bridge 155 and the height of the top surface of the second interstiffener bridge 157 may be greater or less than the heights of the top surfaces of the first to third semiconductor chips 120, 130, and 140. When the semiconductor package 105 further includes a heat sink contacting the first to third semiconductor chips 120, 130, and 140 through the TIM layers, the first and second interstiffener bridges 155 and 157 may be spaced apart from the heat sink or may contact the heat sink through the TIM layers.

As the first and second interstiffener bridges 155 and 157 are arranged on the second chip mounting area AR2 of the package substrate 110, the second chip mounting area AR2 of the package substrate 110 may include a plurality of sub-mounting areas spaced apart from one another in the second horizontal direction (for example, the X direction). The first interstiffener bridge 155 may be arranged between a first sub-mounting area AR2a in which the first edge chip 131 is mounted and a second sub-mounting area AR2b in which the center chip 133 is mounted to separate or partition the first sub-mounting area AR2a from the second sub-mounting area AR2b. The second interstiffener bridge 157 may be arranged between a third sub-mounting area AR2c in which the second edge chip 135 is mounted and the second sub-mounting area AR2b in which the center chip 133 is mounted to separate or partition the third sub-mounting area AR2c from the second sub-mounting area AR2b.

As illustrated in FIG. 6, side walls of the center chip 133 mounted on the second sub-mounting area AR2b may be provided adjacent to and surrounded by the first bridge 1515, the second bridge 1535, the first interstiffener bridge 155, and the second interstiffener bridge 157. The center chip 133 may be exposed to the outside of the stiffener 150a in the vertical direction (for example, the Z direction). The stiffener 150a may not be arranged between the first edge chip 131 and the third edge E3 of the package substrate 110 so that one side wall of the first edge chip 131 adjacent to the third edge E3 of the package substrate 110 may be exposed to the outside of the stiffener 150a. The first edge chip 131 may be exposed to the outside of the stiffener 150a in the second horizontal direction (for example, the X direction) and the vertical direction (for example, the Z direction). The stiffener 150a may not be arranged between the second edge chip 135 and the fourth edge E4 of the package substrate 110 so that one side wall of the second edge chip 135 adjacent to the fourth edge E4 of the package substrate 110 may be exposed to the outside of the stiffener 150a. The second edge chip 135 may be exposed to the outside of the stiffener 150a in the second horizontal direction (for example, the X direction) and the vertical direction (for example, the Z direction).

In embodiments, the stiffener 150a may define a first sub-heat dissipation space HS2a on the first sub-mounting area AR2a, a second sub-heat dissipation space HS2b on the second sub-mounting area AR2b, and a third sub-heat dissipation space HS2c on the third sub-mounting area AR2c. The first sub-heat dissipation space HS2a and the second sub-heat dissipation space HS2b may be separated by the first interstiffener bridge 155 and the third sub-heat dissipation space HS2c and the second sub-heat dissipation space HS2b may be separated by the second interstiffener bridge 157. Because the first sub-heat dissipation space HS2a and the second sub-heat dissipation space HS2b are thermally separated by the first interstiffener bridge 155, thermal coupling between the first edge chip 131 accommodated in the first sub-heat dissipation space HS2a and the center chip 133 accommodated in the second sub-heat dissipation space HS2b may be reduced. Because the third sub-heat dissipation space HS2c and the second sub-heat dissipation space HS2b are thermally separated by the second interstiffener bridge 157, thermal coupling between the second edge chip 135 accommodated in the third sub-heat dissipation space HS2*c* and the center chip 133 accommodated in the second sub-heat dissipation space HS2*b* may be reduced.

A method of manufacturing the semiconductor package 105 may include a process of preparing the package substrate 110, a process of mounting the first to third semiconductor chips 120, 130, and 140 on the package substrate 110, and a process of attaching the stiffener 150*a* onto the package substrate 110.

Figure 8:
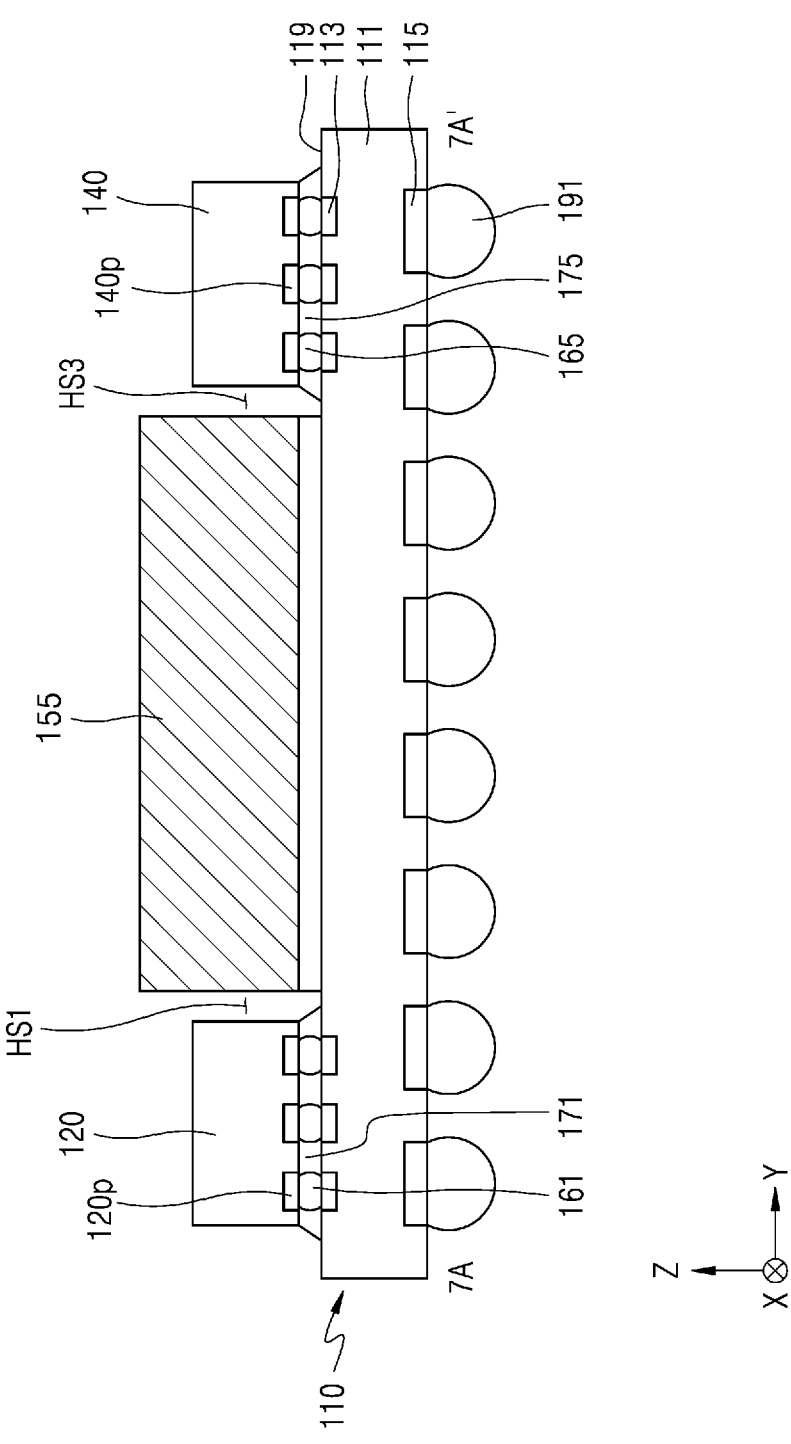
FIG. 8 is a cross-sectional view illustrating a semiconductor package according to an embodiment.

FIG. 8 is a cross-sectional view illustrating a semiconductor package according to an embodiment. Hereinafter, the semiconductor package illustrated in FIG. 8 will be described based on a difference from the semiconductor package 105 described with reference to FIGS. 6 to 7B.

Referring to FIG. 8 together with FIG. 6, the first and second interstiffener bridges 155 and 157 may be spaced apart from the package substrate 110. Because the first interstiffener bridge 155 is spaced apart from the package substrate 110, a gap may be formed between a bottom surface of the first interstiffener bridge 155 and the top surface 119 of the package substrate 110. In addition, because the second interstiffener bridge 157 is spaced apart from the package substrate 110, a gap may be formed between a bottom surface of the second interstiffener bridge 157 and the top surface 119 of the package substrate 110.

While embodiments have been described with reference to the figures, it will be understood by those of ordinary skill in the art that various changes in form and details may be made therein without departing from the spirit and scope as defined by the following claims and their equivalents.

What is claimed is:

1. A semiconductor package comprising:
a package substrate comprising a first chip mounting area, a second chip mounting area, and a third chip mounting area spaced apart from one another in a first direction;
at least one first semiconductor chip on the first chip mounting area;
at least one second semiconductor chip on the second chip mounting area;
at least one third semiconductor chip on the third chip mounting area;
a first stiffener on the package substrate between the first chip mounting area and the second chip mounting area, the first stiffener comprising a first support pillar on a first corner area of the package substrate, a second support pillar on a second corner area of the package substrate, and a first bridge extending from the first support pillar to the second support pillar in a second direction perpendicular to the first direction and between the first chip mounting area and the second chip mounting area;
a second stiffener on the package substrate between the second chip mounting area and the third chip mounting area, the second stiffener comprising a third support pillar on a third corner area of the package substrate, a fourth support pillar on a fourth corner area of the package substrate, and a second bridge extending from the third support pillar to the fourth support pillar in the second direction and between the second chip mounting area and the third chip mounting area; and
a heat sink spaced apart from the first bridge and the second bridge by a heat dissipation space,
wherein the package substrate has a first edge and a second edge, the first chip mounting area provided between the first edge and the second chip mounting area in a plan view, and the third chip mounting area provided between the second edge and the second chip mounting area in a plan view,
wherein the first stiffener is not provided between the first edge of the package substrate and the at least one first semiconductor chip, in a plan view, and
wherein the second stiffener is not provided between the second edge of the package substrate and the at least one third semiconductor chip, in a plan view.

2. The semiconductor package of claim 1, wherein the first bridge and the second bridge continuously contact the package substrate in the second direction.

3. The semiconductor package of claim 1, wherein the first bridge and the second bridge are spaced apart from the package substrate.

4. The semiconductor package of claim 1, wherein each of the at least one first semiconductor chip and the at least one third semiconductor chip comprises a memory chip,
wherein the at least one second semiconductor chip comprises a system on chip (SOC) and a power management integrated circuit (PMIC) chip,
wherein the first stiffener is not provided on a first side wall of the at least one first semiconductor chip closest to the first edge of the package substrate, and
wherein the second stiffener is not provided on a first side wall of the at least one third semiconductor chip closest to the second edge of the package substrate.

5. The semiconductor package of claim 4, wherein the at least one first semiconductor chip is exposed to an outside of the first stiffener in the first direction and a third direction,
wherein the at least one second semiconductor chip is exposed to the outside of the first stiffener and an outside of the second stiffener in the second direction and the third direction,
wherein the at least one third semiconductor chip is exposed to the outside of the second stiffener in the first direction and the third direction, and
wherein the third direction is perpendicular to the first direction and the second direction.

6. The semiconductor package of claim 1, wherein the heat sink is on a top surface of the at least one second semiconductor chip through a first thermal interface material (TIM) layer, and
wherein a height of the top surface of the first stiffener and a height of the top surface of the second stiffener are different from a height of the top surface of the at least one second semiconductor chip.

7. The semiconductor package of claim 1, further comprising at least one interstiffener bridge extending from the first stiffener to the second stiffener in the first direction,
wherein the at least one interstiffener bridge divides the second chip mounting area into two or more sub-mounting areas, and
wherein the at least one second semiconductor chip comprises a plurality of semiconductor chips on the two or more sub-mounting areas.

8. The semiconductor package of claim 7, wherein the at least one interstiffener bridge comprises a first interstiffener bridge and a second interstiffener bridge respectively extending from the first bridge to the second bridge in the first direction and spaced apart from each other in the second direction,
wherein the second chip mounting area comprises a first sub-mounting area adjacent to a first edge of the package substrate, a second sub-mounting area separated from the first sub-mounting area by the first interstiffener bridge, and a third sub-mounting area separated from the second sub-mounting area by the second interstiffener bridge and adjacent to a second edge of the package substrate, wherein the at least one second semiconductor chip comprises:

a first PMIC chip on the first sub-mounting area;

a system on chip (SOC) on the second sub-mounting area; and a second PMIC chip on the third sub-mounting area, and wherein side walls of the SOC are adjacent to the first bridge, the second bridge, the first interstiffener bridge, and the second interstiffener bridge.

9. The semiconductor package of claim 8, wherein the first interstiffener bridge and the second interstiffener bridge continuously contact the package substrate in the first direction.

10. The semiconductor package of claim 8, wherein the first interstiffener bridge and the second interstiffener bridge are spaced apart from the package substrate.

11. The semiconductor package of claim 8, wherein the first bridge, the second bridge, the first interstiffener bridge, and the second interstiffener bridge are included in a single stiffener.

12. The semiconductor package of claim 11, wherein the first PMIC chip is exposed to an outside of the single stiffener in the second direction and a third direction, wherein the SOC is exposed to the outside of the single stiffener in the third direction, wherein the second PMIC chip is exposed to the outside of the single stiffener in the second direction and the third direction, and wherein the third direction is perpendicular to the first direction and the second direction.

13. The semiconductor package of claim 1, wherein the first stiffener and the second stiffener are symmetrical with each other in a plan view.

14. The semiconductor package of claim 1, wherein each of the first corner area, the second corner area, the third corner area, and the fourth corner area comprises a vertex of a surface of the package substrate, wherein the first chip mounting area is between the first corner area and the second corner area, and wherein the third chip mounting area is between the third corner area and the fourth corner area.

15. A semiconductor package comprising:

a package substrate comprising a first chip mounting area, a second chip mounting area, and a third chip mounting area spaced apart from one another in a first direction;

a stiffener on the package substrate, the stiffener forming a first heat dissipation space on the first chip mounting area, a second heat dissipation space on the second chip mounting area, and a third heat dissipation space on the third chip mounting area;

at least one first semiconductor chip on the first chip mounting area and in the first heat dissipation space;

at least one second semiconductor chip on the second chip mounting area and in the second heat dissipation space;

at least one third semiconductor chip on the third chip mounting area and in the third heat dissipation space; and a heat sink, wherein the stiffener comprises:

a first stiffener comprising a first support pillar on a first corner area of the package substrate, a second support pillar on a second corner area of the package substrate, and a first bridge extending from the first support pillar to the second support pillar in a second direction perpendicular to the first direction and between the first chip mounting area and the second chip mounting area; and a second stiffener mounted on the package substrate between the second chip mounting area and the third chip mounting area, the second stiffener comprising a third support pillar on a third corner area of the package substrate, a fourth support pillar on a fourth corner area of the package substrate, and a second bridge extending from the third support pillar to the fourth support pillar in the second direction and between the second chip mounting area and the third chip mounting area, wherein the first heat dissipation space, the second heat dissipation space, and the third heat dissipation space are spaced apart from one another, wherein the first heat dissipation space, the second heat dissipation space, and the third heat dissipation space are exposed to an outside of the stiffener in a third direction, and wherein the first bridge and the second bridge are spaced apart from the heat sink by a heat dissipation space.

16. The semiconductor package of claim 15, wherein the stiffener comprises:

a first interstiffener bridge extending from the first bridge to the second bridge in the first direction; and a second interstiffener bridge extending from the first bridge to the second bridge in the first direction and spaced apart from the first interstiffener bridge in the second direction, wherein the second heat dissipation space comprises:

a first sub-heat dissipation space and a second sub-heat dissipation space separated by the first interstiffener bridge; and a third sub-heat dissipation space separated from the second sub-heat dissipation space by the second interstiffener bridge, and wherein the third sub-heat dissipation space is adjacent to the first bridge, the second bridge, the first interstiffener bridge, and the second interstiffener bridge in a plan view.

17. The semiconductor package of claim 16, wherein each of the at least one first semiconductor chip and the at least one third semiconductor chip comprises a memory chip, and wherein the at least one second semiconductor chip comprises:

PMIC chips in the first sub-heat dissipation space and the third sub-heat dissipation space; and an SOC in the second sub-heat dissipation space.

18. A semiconductor package comprising:

a package substrate comprising a first chip mounting area, a second chip mounting area, and a third chip mounting area spaced apart from one another in a first direction, the second chip mounting area comprising a first sub-mounting area, a second sub-mounting area, and a third sub-mounting area spaced apart from one another in a second direction perpendicular to the first direction;

a first memory chip on the first chip mounting area;

a first PMIC chip on the first sub-mounting area;

a system on chip (SOC) on the second sub-mounting area;

a second PMIC chip on the third sub-mounting area;

a second memory chip on the third chip mounting area;

a first stiffener on the package substrate between the first chip mounting area and the second chip mounting area, the first stiffener comprising a first support pillar on a first corner area of the package substrate, a second support pillar on a second corner area of the package substrate, and a first bridge extending from the first support pillar to the second support pillar in the second direction and between the first chip mounting area and the second chip mounting area;

a second stiffener on the package substrate between the second chip mounting area and the third chip mounting area, the second stiffener comprising a third support pillar on a third corner area of the package substrate, a fourth support pillar on a fourth corner area of the package substrate, and a second bridge extending from the third support pillar to the fourth support pillar in the second direction and between the second chip mounting area and the third chip mounting area;

a first interstiffener bridge extending from the first bridge to the second bridge in the first direction and between the first sub-mounting area and the second sub-mounting area;

a second interstiffener bridge extending from the first bridge to the second bridge in the first direction and between the second sub-mounting area and the third sub-mounting area; and a heat sink spaced apart from the first bridge and the second bridge by a heat dissipation space, and wherein side walls of the SOC are adjacent to the first bridge, the second bridge, the first interstiffener bridge, and the second interstiffener bridge, wherein the package substrate comprises:

a first edge extending in the second direction and closer to the first chip mounting area; and a second edge extending in the second direction and closer to the third chip mounting area, wherein the first stiffener is not provided between the first edge of the package substrate and the first memory chip, in a plan view, and wherein the second stiffener is not provided between the second edge of the package substrate and the second memory chip, in a plan view.

19. The semiconductor package of claim 18, wherein the first bridge, the second bridge, the first interstiffener bridge, and the second interstiffener bridge are included in a single stiffener, wherein the first memory chip and the second memory chip are exposed to an outside of the single stiffener in the first direction and a third direction, wherein the first PMIC chip and the second PMIC chip are exposed to the outside of the single stiffener in the second direction and the third direction, wherein the SOC is exposed to the outside of the single stiffener in the third direction, and wherein the third direction is perpendicular to the first direction and the second direction.

* * * * *